United States Patent
Dumitrescu et al.

(10) Patent No.: US 10,354,033 B2
(45) Date of Patent: Jul. 16, 2019

(54) MAPPING APPLICATION FUNCTIONAL BLOCKS TO MULTI-CORE PROCESSORS

(71) Applicant: Intel Corporation, Santa Clara, CA (US)

(72) Inventors: Cristian Florin Dumitrescu, Shannon (IE); Jasvinder Singh, Shannon (IE); Patrick Lu, Chandler, AZ (US)

(73) Assignee: INTEL CORPORATION, Santa Clara, CA (US)

( * ) Notice: Subject to any disclaimer, the term of this patent is extended or adjusted under 35 U.S.C. 154(b) by 7 days.

(21) Appl. No.: 15/711,740

(22) Filed: Sep. 21, 2017

(65) Prior Publication Data

US 2018/0107766 A1 Apr. 19, 2018

Related U.S. Application Data

(60) Provisional application No. 62/409,747, filed on Oct. 18, 2016.

(51) Int. Cl.
| | |
|---|---|
| *G06F 17/50* | (2006.01) |
| *G06F 9/54* | (2006.01) |
| *G06F 9/50* | (2006.01) |
| *H04L 29/06* | (2006.01) |

(52) U.S. Cl.
CPC .......... *G06F 17/505* (2013.01); *G06F 9/5066* (2013.01); *G06F 9/546* (2013.01); *H04L 67/42* (2013.01)

(58) Field of Classification Search
CPC ......... G06F 17/505; G06F 9/546; H04L 67/42
USPC .................................................. 716/101, 104
See application file for complete search history.

(56) References Cited

U.S. PATENT DOCUMENTS

| 8,180,963 | B2 * | 5/2012 | Conte et al. ........ G06F 12/0811 |
| | | | 711/114 |
| 9,329,900 | B2 * | 5/2016 | Narvaez et al. ...... G06F 9/5094 |
| 9,448,829 | B2 * | 9/2016 | Narvaez et al. .... G06F 9/45558 |
| 9,639,372 | B2 * | 5/2017 | Narvaez et al. ...... G06F 9/3891 |
| 9,672,046 | B2 * | 6/2017 | Subbareddy et al. .... G06F 9/44 |
| 9,727,345 | B2 * | 8/2017 | Weissmann et al. ........................ |
| | | | G06F 9/5077 |

\* cited by examiner

*Primary Examiner* — Sun J Lin
(74) *Attorney, Agent, or Firm* — Grossman, Tucker, Perreault & Pfleger, PLLC

(57) ABSTRACT

One embodiment provides a system to identify a "best" usage of a given set of CPU cores to maximize performance of a given application. The given application is parsed into a number of functional blocks, and the system maps the functional blocks to the given set of CPU cores to maximize the performance of the given application. The system determines and then tests various mappings to determine the performance, generally preferring mappings that maximize throughput per physical core. Before testing a mapping, the system determines whether the mapping is redundant with any previously tested mappings. In addition, given a performance target for the given application, the system determines a minimum number of CPU cores needed for the application to meet the application performance target.

24 Claims, 9 Drawing Sheets

MAPPING APPLICATION FUNCTIONAL BLOCKS TO MULTI-CORE PROCESSORS

CROSS-REFERENCE TO RELATED APPLICATION

This U.S. Non-Provisional application claims the benefit of U.S. Provisional Application Ser. No. 62/409,747, filed Oct. 18, 2016, which is hereby incorporated by reference in its entirety.

FIELD

The present disclosure relates to mapping application functional blocks to multi-core processors.

BACKGROUND

The next generation packet processing applications for Cloud and/or network functions virtualization (NFV) environments run on top of Common Off-The-Shelf (COTS) server blades with multi-core CPUs. With the continuous advancements in CPU technology, more and more CPU cores are available on the platform, however, applications are not able to efficiently take advantage of this "sea of cores," and thus application and/or system resource performance frequently suffers despite an increasing availability of both processing power and processing bandwidth.

BRIEF DESCRIPTION OF DRAWINGS

Features and advantages of the claimed subject matter will be apparent from the following detailed description of embodiments consistent therewith, which description should be considered with reference to the accompanying drawings, wherein:

Although the following Detailed Description will proceed with reference being made to illustrative embodiments, many alternatives, modifications, and variations thereof will be apparent to those skilled in the art.

DETAILED DESCRIPTION

The present disclosure provides systems, logic and methodologies to identify a "best" usage of a given set of CPU cores to maximize the performance of a given application. The application may be parsed into a plurality of functional blocks, and the present disclosure provides methodologies to map the functional blocks to CPU cores to maximize application performance. In addition, given an application performance target, the present disclosure provides methodologies to determine of a minimum number of CPU cores needed for the application to meet the performance target, as well as the mapping of the application functional blocks to CPU cores.

Throughout this disclosure, reference is made to "assignments" of functional blocks of an application to logical cores, as well as "mappings" and "topologies." These terms are used interchangeably, and are not meant to limit the disclosure in any way. Reference is also made throughout this disclosure to "logical cores," "hardware (HW) threads" and "hyper-threads," which are similarly used interchangeably without intent to limit the disclosure.

Figure 1:
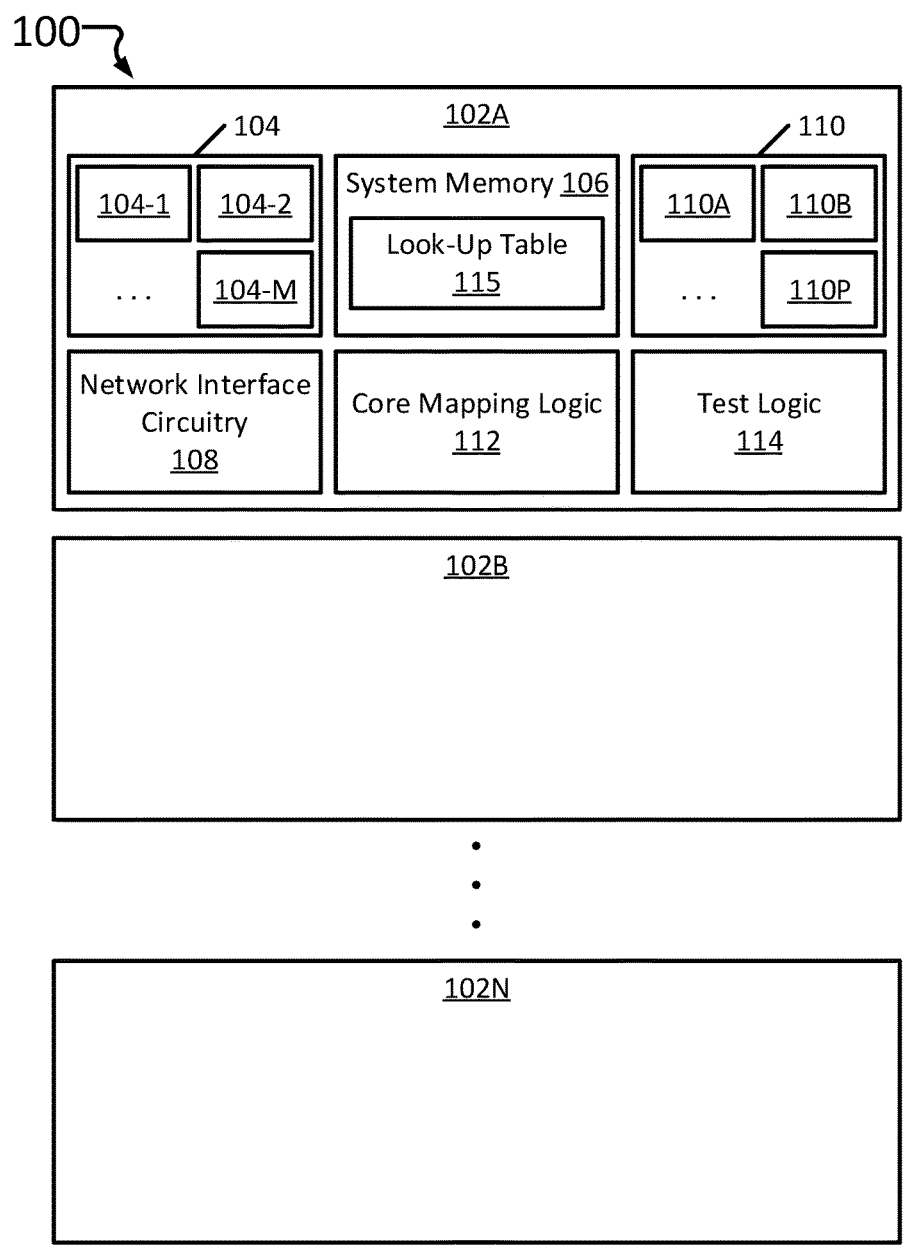
FIG. 1 illustrates a processing environment consistent with various embodiments of the present disclosure.

FIG. 1 illustrates a processing environment 100 consistent with various embodiments of the present disclosure. Environment 100 generally includes a plurality network node elements 102A, 102B, . . . , 102N in communication with one another and collectively, for example, forming a "cloud" server processing environment. Each network node element 102A, 102B, . . . , 102N may include, for example, stand-alone computer systems, server blades, etc. The environment 100 may be generally configured to communicate with a plurality of remote systems (not shown) to perform, for example, cloud-based storage, cloud-based processing, etc. Although each node element 102A, 102B, . . . , 102N may be similarly configured, node element 102A is described herein as a representative example of each element in the system 100. Network node element 102A generally includes a host processor 104, system memory 106 and network interface circuitry 108. Host processor 104 is a multi-core processor such as the Intel® Xeon® multi-core processor, ARM processor, MIPS processor, PowerPC processor, and/or other multi-core processor. The host processor 104 may have a defined number of physical processing cores 104-1, 104-2, . . . , 104-M, for example, 2, 4, 6, etc. physical cores.

Figure 1A:
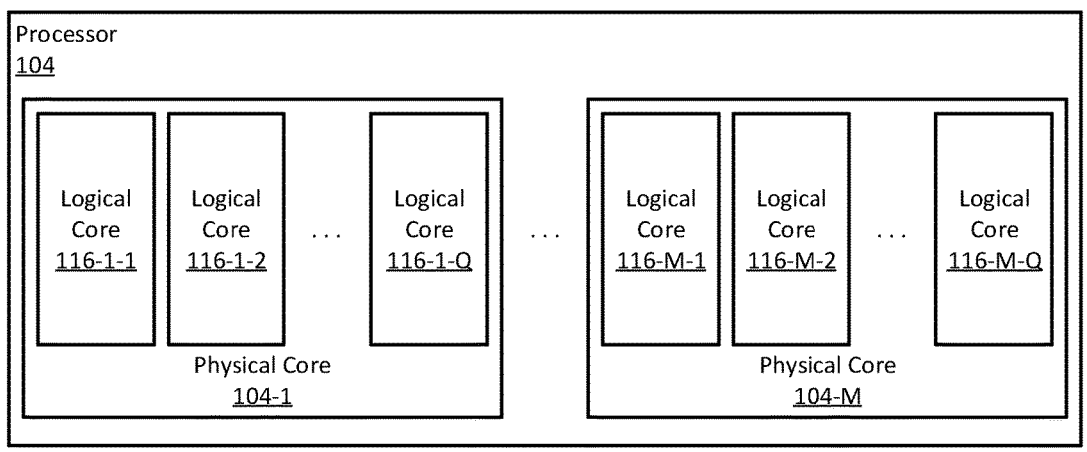
FIG. 1A illustrates an expanded view of a host processor consistent with the present disclosure.

FIG. 1A illustrates an expanded view 101 of host processor 104 consistent with the present disclosure. Each physical core 104-1, 104-2, . . . , 104-M includes at least one logical core. For example, physical core 104-1 includes a plurality of logical cores 116-1-1, 116-1-2, . . . , 116-1-Q, and physical core 104-M includes a plurality of logical cores 116-M-1, 116-M-2, . . . , 116-M-Q; where Q is the number of logical cores associated with a physical core. Of course, the above example assumes that each physical core 104-1, 104-2, . . . , 104-M includes the same number (Q) of logical cores. In other embodiments, two or more physical cores 104-1, 104-2, . . . , 104-M may have a different number of logical cores. In some embodiments, hardware resources of a physical core 104-1, 104-2, . . . , 104-M may be duplicated (e.g., register files and other resources) and shared by the logical cores associated with the physical core (e.g., L1 cache memory). Examples of logical core topologies include pipeline, run-to-completion, hybrid, etc. As an example, the host processor 104 may be a dual socket CPU, each socket having 8 physical cores and each physical core having 2 logical cores.

Referring again to FIG. 1, the system memory 106 may host an operating system (OS, not shown) (e.g., Linux, Windows, etc.). Node element 102A also includes at least one application 110 generally configured as instruction sets (e.g., code) to be executed on one or more physical cores 104-1, 104-2, . . . , 104-M using one or more logical cores. The application 110 may be hosted in, for example, system memory 106. The application 110 may include, for example, a packet processing application for processing packets to and from one or more remote systems (not shown) in communication with server system 102A. Of course, packet processing is only one example of the type of application that may be utilized by the present disclosure, and the present disclosure is not limited to any specific application type. The application 110 may include a plurality of "functional blocks" 110A, 110B, . . . 110P. A "functional block," as used herein, may be generally defined as an operational subset of the application, for example, an instruction (or set of instructions) that define one or more operational tasks of the application 110. In the context of a packet processing application example, the functional blocks 110A, 110B, . . . 110P may represent packet reception, flow classification, wildcard classification/an access control list (ACL), traffic metering/policing, routing, traffic management, packet transmission, etc. Of course, packet processing is only one example of a type of application 110, and it should be understood that a functional block may be defined based on, for example, the nature of the application, processing requirements, resource requirements, etc. Each functional block 110A, 110B, . . . 110P may be a priori defined, and may be structured as a sequence of operations, for example functional block 110A is executed and the results thereof are used as inputs to functional block 110B, etc. Each functional block can be instantiated one or several times as part of the application 110, and the application 110 may be instantiated one or several times (resulting in corresponding instances of each functional block).

As will be described below, in some embodiments each instance of a functional block 110A, 110B, . . . 110P may be mapped to a single CPU core 104A, 104B, . . . , 104M, meaning that only that specific CPU core is running (executing) this instance, while several instances (belonging to the same functional block or to different functional blocks) can be mapped to the same CPU core, meaning that the CPU core may run (execute) all the block instances mapped to it The functional blocks 110A, 110B, . . . 110P may be connected together with the purpose of passing data (e.g., packets) from one block to the next blocks, so that the application functionality gets implemented. Thus, the present disclosure provides a topology of interconnected functional block instances, as well as a topology of interconnected CPU cores. The application 110 may be designed or developed such that its functional blocks are agnostic to which logical core they are mapped to. For example, functional block 110A may be mapped to logical core 116A while functional block 110B may be mapped to logical core 116Q, etc.

System 102A also includes core mapping logic 112 configured to map at least one instance of a functional block 110A, 110B, . . . 110P to at least one logical core of at least one physical core 104A, 104B, . . . , 104M. The core mapping logic 112 may be configured to generate a table (e.g., look-up table (LUT) 115) of combinations of assignments of functional blocks 110A, 110B, . . . 110P to at least one logical core of at least one physical core 104A, 104B, . . . , 104M. The LUT 115 may be hosted in system memory 106, and may represent the total number (or some subset thereof) of such combinations, given the total number of physical and logical cores of the host processor 104. Core mapping logic 112 may also be configured to reduce the number of mapping combinations by eliminating redundant combinations, for example, if it is assumed that the physical cores of processor 104 are generally functionally equivalent to one another and that the logical cores are generally functionally equivalent to one another. Operations of core mapping logic 112 are described in greater detail below. In addition, system 102A includes test logic 114 configured to test one or more combinations listed in the LUT 115. For each combination, the test logic 114 may be configured to determine a metric X. For example, metric X may include packet throughput (in million packets per second (mpps)), packet throughput per physical core (in mpps), etc. The metric may be used by the core mapping logic 112 to determine an optimal mapping that achieves a defined performance threshold and/or provides the highest performance using the fewest number of physical cores. These and other operations are described in greater detail below.

The functional blocks 110A, 110B, . . . 110P may include external interfaces (e.g., queues, not shown in this figure) to allow maximum flexibility on mapping the block instances to CPU cores. This may enable core mapping logic 112 to map any block instance to any CPU core, regardless of whether the neighboring block instances (i.e. the block instances connected to the current block instance) are collocated with the current block instance (i.e. are mapped to the same CPU core as the current block instance) or not. Accordingly, each functional block 110A, 110B, . . . 110P may include a set of instructions that define an operation (or set of operations) that can be agnostic to the overall application and the operating environment of the application.

Figure 2:
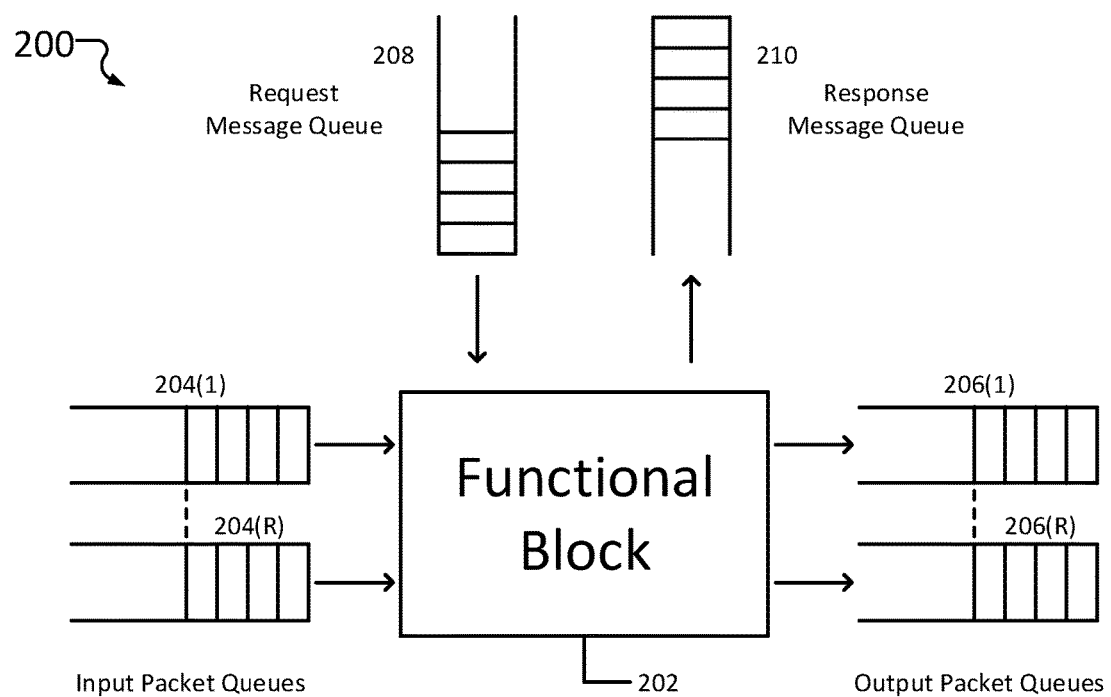
FIG. 2 illustrates an application functional block topology according to one embodiment of the present disclosure.

FIG. 2 illustrates an application functional block and its interfaces 200 according to one embodiment of the present disclosure. The functional block topology 200 of FIG. 2 is an example of a functional block 110A, 110B, . . . , and/or 110P depicted in FIG. 1. Thus, with continued reference to FIG. 1, the functional block 200 of this embodiment includes functional block code 202 generally configured to perform one or more data processing operations (tasks) of an application, a plurality of input packet queues 204(1) . . . 204(R), a plurality of output packet queues 206(1) . . . 206(R), at least one request message queue 208 and at least one response message queue 210. Each of the queues depicted in FIG. 2 may be instanced, for example, in system memory 106. In some embodiments, a single type of packet queue can fulfill two different roles at the same time (input packet queue or output packet queue) rather than two different types of packet queues (input packet queue and output packet queue).

Packet queues operate as packet transfer interfaces, where the same packet queue can be an output packet queue for block A and an input packet queue for block B, thus connecting block A to block B. The message queues are generally used to convey configuration request changes to the functional block (e.g., via request message queue 208) and responses to the configuration change back to the requester (e.g., via response message queue 210). The functional block code 202 generally performs a packet processing function, e.g. given a burst of packets read from the next input packet queue of the current block instance, apply the packet processing function on each packet from the burst of input packets until each packet is either dropped or written successfully to one of the output packet queues. As described above, the functional blocks of the application may be designed to utilize this interface of packet queue/ message queue in order to be able to "stitch" them together and/or map or remap them to various logical cores.

Block instances may be connected through packet queues. For example, block instance A is connected to block instance B by having the same packet queue functioning as an output packet queue for block instance A and an input packet queue for block instance B. The block instance input and output message queues can be used by an external controller (not shown) or Command Line Interface (CLI) (not shown) to dispatch configuration requests to the current block instance and get responses back from the block instance (e.g. status of the requested configuration operation, any associated data, etc.).

The packet queues may be implemented using single-producer single-consumer lockless queues, i.e. circular buffers stored in, for example, system memory 106, external DDR memory of the CPU (or any other memory address space that is shared by all CPU cores) which have the producer (software (SW) thread writing to the queue) and the consumer (SW thread reading from the queue) potentially running in parallel on two different CPU cores.

The lockless queue mechanism is generally stable regardless of whether, e.g., the consumer and the producer of a given lockless queue are the same SW thread or two different SW threads running on different CPU cores. However, the cost of the lockless queue mechanism may differ in each case; in the former case (e.g., wherein the consumer and producer of the given lockless queue are running on the same SW thread), the cost of reading one element (e.g., packet) from/writing one element (e.g., packet) to the lockless queue is generally relatively small (e.g., on the order of 10 CPU cycles), as the lockless queue is typically residing in the L1/L2 cache of a single CPU core. In the latter case (e.g., wherein the consumer and producer of the given lockless queue are two different SW threads running on the same or different CPU cores), the cache lines of the lockless queue may be bounced back and forth between the L1/L2 cache of the producer CPU core and the L1/L2 cache of the consumer CPU core (the L1/L2 cache is private to each CPU core, i.e. each CPU core has its share of L1/L2 cache which cannot be accessed by any other CPU core), according to the requirements of the CPU memory coherency mechanism. This "cache thrashing" may drive the cost of read/write accesses to the lockless queue to tens or even hundreds of CPU cycles. Thus, in some embodiments, core mapping logic 112 is configured to affinitize (e.g., bind) each SW thread to a corresponding logical core.

Figure 3:
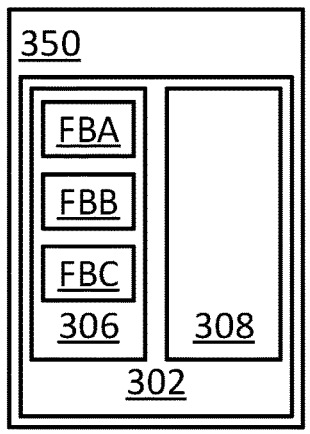
FIG. 3 illustrates an example of a set of combinations of functional blocks mapped to logical cores of a single physical core.
Figure 3:
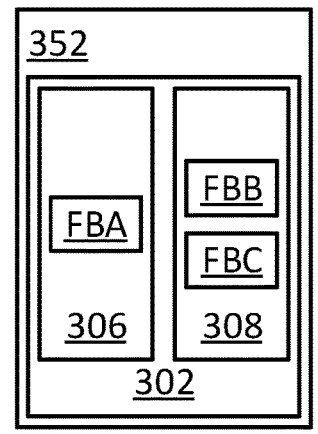
Figure 3:
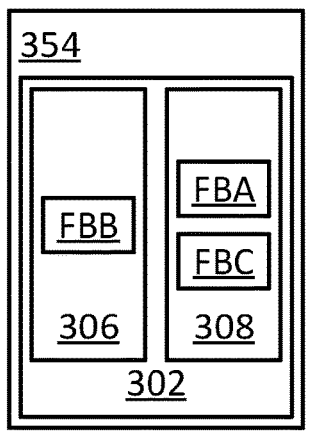
Figure 3:
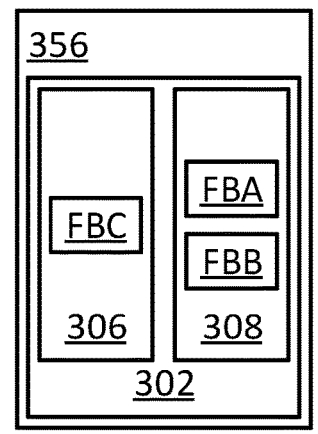
Figure 3:
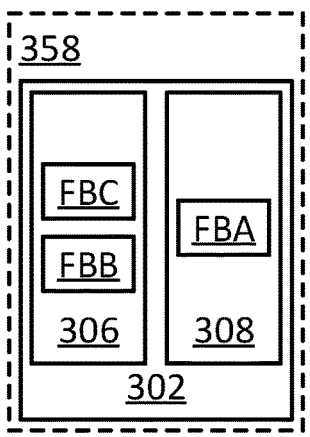
Figure 3:
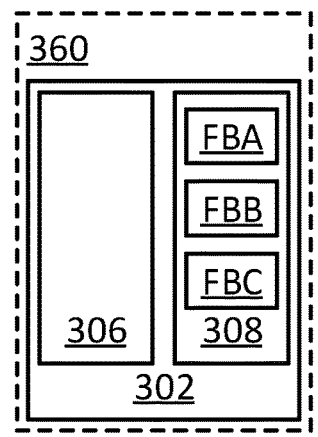

FIG. 3 illustrates an example of a set of combinations 300 of functional blocks mapped to logical cores of a single physical core. The sets described herein may be determined by the core mapping logic 112 and tested by test logic 114 (FIG. 1). In the example of FIG. 3, it is assumed that there are three functional blocks labelled A, B and C (hereafter referred to as FBA, FBB and FBC, which may correspond to functional blocks 110A, 110B, and 110C of FIG. 1). In addition, for this example it is assumed that there is a single physical core 302 available and that physical core 302 has two logical cores 306 and 308. As a general matter, the core mapping logic 112 is configured to map functional blocks to physical and logical cores, and test logic 114 is configured to determine a mapping that balances the goals of maximizing throughput while utilizing the fewest physical cores. The core mapping logic 112 may map the functional blocks to logical cores by assigning input and output message queues accordingly, as described above with reference to FIG. 2. Determining the set of combinations may start by assigning all functional blocks A, B and C to logical core 306 of physical core 302, as shown at 350. In another combination, FBA may be assigned to 306, and FBB and FBC may be assigned to 308, as shown at 352. In another combination, FBB may be assigned to 306, and FBA and FBC assigned to 308, as shown at 354. In another combination, FBC may be assigned to 306, and FBA and FBB may be assigned to 308, as shown at 356. These combinations may be tested (as described below) and/or stored, for example, in a look-up table (LUT) 115 in system memory 106.

The number of possible permutations of assigning functional blocks to physical and logical cores is generally on the order of $\Sigma_{PC=1}^{PC_{Max}}(PC \times LC)^{FB}$; where PC=the number of physical cores (where PC="M" from FIG. 1), LC=the number of logical cores per physical core (where LC="Q" from FIG. 1A), and FB=the number of functional blocks (where FB="P" from FIG. 1). Thus, as can be appreciated, the number of different combinations can grow quite large. In order to reduce the number of combinations to be tested, the core mapping logic 112 may also be configured to eliminate redundant combinations. "Redundant," as used herein, means that two mappings are functionally equivalent. Functional equivalence may be due to (A) all physical cores having functionally identical capabilities, meaning any two physical cores are functionally interchangeable, and/or (B) all the logical cores of any given physical core having identical capabilities, meaning they are functionally interchangeable. Mappings that are redundant with a previous mapping are illustrated with a dashed outline in FIG. 3 and FIG. 4, below, while the first (e.g., smallest identifier number) of a set of redundant mappings is illustrated with a solid outline. In some embodiments, logical cores (e.g., 306, 308) within the same physical core (e.g., 302) may be considered interchangeable for purposes of determining redundancy. For example, with continued reference to FIG. 3, in another permutation, FBC and FBB may be assigned to 306, and FBA may be assigned to 308, as shown at 358. However, the permutation shown at 358 is redundant with that shown at 352; both contain FBA on one logical core and FBB and FBC on another logical core in the same physical core (302). For illustrative purposes, as 352 is the first depicted permutation of this set of redundant permutations (e.g., 352<358), 352 is depicted with a solid outline while 358 is depicted with a dashed outline, as described above. Similarly, the permutation shown at 360 is redundant with that shown at 350, as both have FBA, FBB and FBC assigned to a single logical core on the same physical core.

Figure 4:
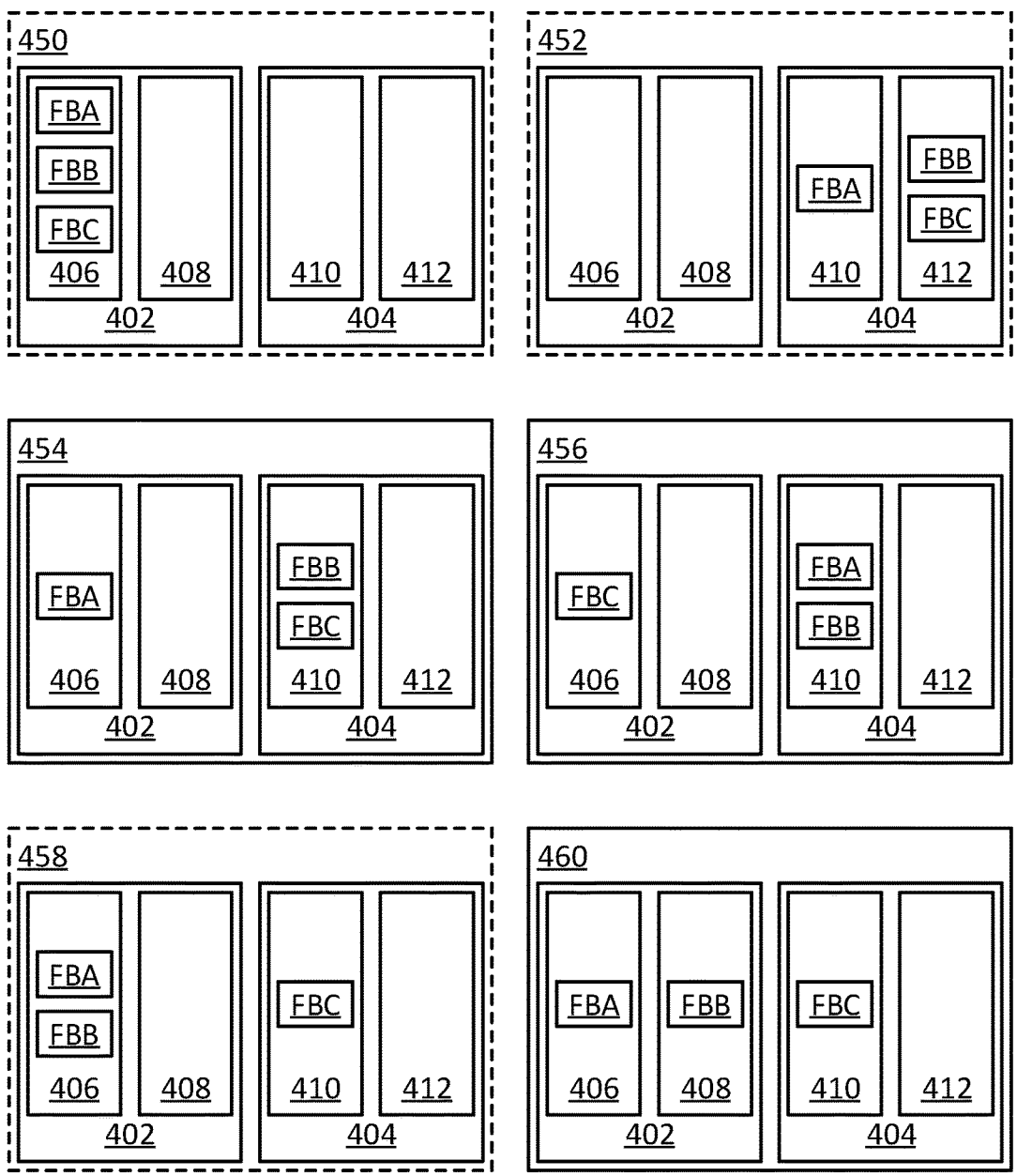
FIG. 4 illustrates an example of a set of combinations of functional blocks mapped to logical cores of a CPU having two physical cores.

FIG. 4 illustrates an example of a set of combinations 400 of functional blocks mapped to logical cores of a CPU having two physical cores. The examples shown in FIG. 4 have two physical cores (e.g., 402 and 404), with each physical core having two logical cores (e.g., 406, 408, 410 and 412). Physical core 402 and logical cores 406 and 408 may correspond to physical core 302 and logical cores 306 and 308 of FIG. 3. Determining the set of combinations may start by assigning all functional blocks A, B and C to logical core 406 of physical core 402, as shown at 450. However, in some embodiments, assuming physical core 402 is the same as physical core 302 of FIG. 3, 450 may be redundant with 350, as the added consideration of another physical core (e.g., 404) may have negligible or no impact on the performance of the topology if the additional physical core is unused. In another combination 452, FBA may be assigned to 410 while FBB and FBC are assigned to 412. Note that combination 452 is redundant with 352, even though the functional blocks are assigned to logical cores on a different physical core (e.g., 404 vs. 302). Similarly, a permutation (not shown) wherein, for example, FBA were assigned to 406 and FBB and FBC were assigned to 408 would be redundant with 352, for the same reasons.

In another combination 454, FBA may be assigned to 406 and FBB and FBC may be assigned to 410. 454 is not redundant with previous combinations such as 452 because, while logical cores on the same physical core may be treated as interchangeable for evaluating redundancy, logical cores on different physical cores generally are not. In another combination 456, FBC may be assigned to 406 and FBA and FBB may be assigned to 410. In another combination 458, FBC may be assigned to 410 and FBA and FBB may be assigned to 406. 458 and 456 are redundant with one another because they share the same distribution of logical cores amongst physical cores. Even though the distributions are "mirrored," because physical cores are interchangeable for purposes of this disclosure, the two permutations are redundant. As described above, for purposes of illustration, the first permutation 456 of the redundant set is shown with a solid outline while the latter 458 is shown with a dashed outline. In another combination 460, FBA may be assigned to 406, FBB may be assigned to 408, and FBC may be assigned to 410. Other non-redundant combinations not shown in FIG. 4 may be readily apparent, such as, for example, one wherein FBA is assigned to 406, FBB is assigned to 410, and FBC is assigned to 412.

According to the teachings of the present disclosure, it may be assumed that the physical cores are each generally functionally equivalent to one another, and that the logical cores of the same physical core are generally functionally equivalent to one another. As used herein, "generally functionally equivalent" means that each physical core operates in the same or similar manner, and has the same or similar operational characteristics such as, for example, processing bandwidth, speed, resources, etc., and that each logical core of the same physical core operates in the same or similar manner, and has the same or similar operational characteristics such as, for example, processing bandwidth, speed, resources, etc.

In order to reduce the number of combinations to be tested and/or reduce the size of the LUT 115, the core mapping logic 112 may also be configured to eliminate redundant combinations. As alluded to above, the number of permutations for assigning functional blocks to logical and physical cores can grow very large. However, since in the present disclosure the logical cores may be considered to be operationally and/or functionally equivalent (within the same physical core(s)), many of these possible permutations may be dismissed as redundant. Using the example operation 460 above, and again assuming general functional equivalence between physical cores and between logical cores of the same physical core, some redundant combinations of the assignments depicted would be assigning FBA to 408, assigning FBB to 406, and assigning FBC to either of 410 or 412.

In the example of FIG. 3, there are 8 (though only 6 are shown) different possible permutations of mapping functional blocks to physical and logical cores, while the example of FIG. 4 including a second physical core 404 has 64 possible permutations, bringing the total for both examples to 72. However, as shown in FIG. 3, there are 4 non-redundant combinations, and in the example of FIG. 4 there are 6 non-redundant combinations (though not all non-redundant combinations are shown in FIG. 4), bringing the total to 10. Thus, the redundancy detection/elimination procedure described herein may reduce the number of possible mappings to test in these two examples by over 80%.

As a non-redundant assignment is determined, the testing logic 114 is configured to implement a testing (or evaluation) protocol and to determine a value of at least one performance metric (e.g., throughput per physical core) for the application. To implement a testing protocol, the logic 114 is configured to map functional blocks of the application to logical and physical cores according to the non-redundant assignment, and the logic 114 causes the application to be executed on the processor. The logic 114 is also configured to monitor one or more performance criteria to determine at least one performance metric while the application is being executed on the logical and physical cores as determined by the assignment. In one embodiment, the performance metric may be the ratio of the throughput (e.g., mpps) of the application under the assigned mapping to the number of physical cores used.

As an illustrative example, assume an application provides a best overall throughput rate of 8 mpps when its set of block instances is mapped to 4 physical CPU cores and 5 mpps when mapped to 2 physical CPU cores. The best overall throughput rate for a given number of physical cores may depend upon the distribution of functional blocks amongst the logical cores of the physical cores. Thus, of the two examples provided, the best overall throughput rate is 5 Mpps when the block instances are mapped to 2 physical cores. Similar testing and analysis may be performed to determine the best overall throughput rate when the functional blocks are mapped to 4 physical cores instead.

For the former mapping of the above example (e.g., functional blocks mapped to 4 physical cores), the performance per physical CPU core is 8 mpps/4=2 mpps, while for the latter mapping (e.g., functional blocks mapped to 2 physical cores), the performance per physical CPU core is 5 mpps/2=2.5 mpps. The latter mapping of this example is more efficient; instead of using 4 physical CPU cores to achieve 8 mpps, a set of 2 physical CPU cores can be used to get 5 mpps, while the remaining set of 2 physical CPU cores may be used, for example, to run an additional set of block instances (i.e. an additional application instance) to get another 5 mpps, leading to a grand total of 10 Mpps. Thus, using two instances of the application, each assigned to 2 physical cores yields a better throughput than using a single instance mapped to 4 physical cores. In another illustrative example, an application may provide an overall throughput rate of 11 mpps when mapped to 4 physical cores and 5 mpps when mapped to 2 physical cores. In this case, the former mapping would be more efficient (11 mpps/4 Cores=2.75 mpps/Core>5 mpps/2 Cores=2.5 mpps/Core), despite requiring twice as many physical CPU cores.

Figure 5:
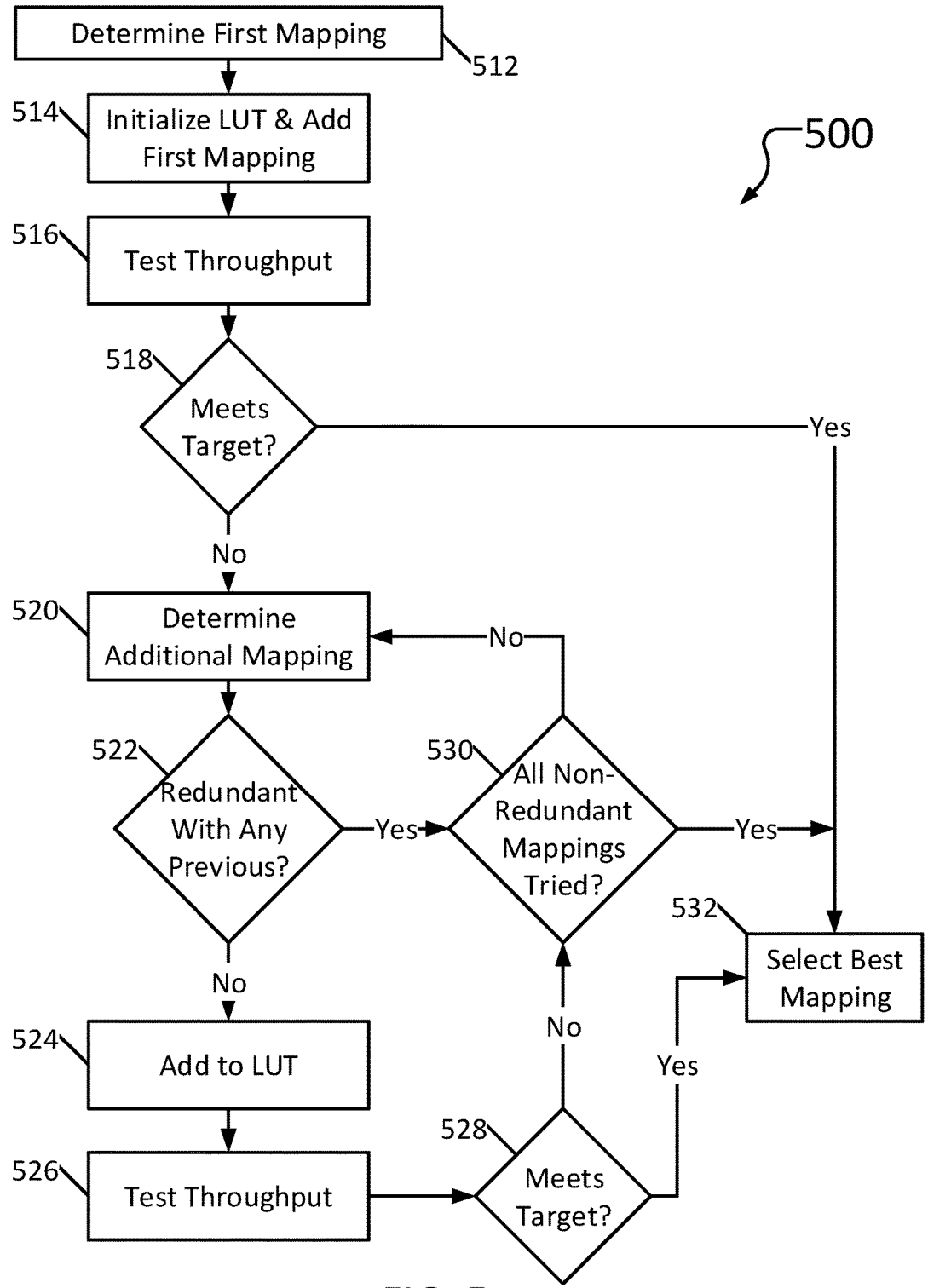
FIG. 5 is a flowchart illustrating operations according to one embodiment of the present disclosure.

FIG. 5 is a flowchart illustrating operations 500 according to one embodiment of the present disclosure. The operations depicted in FIG. 5 may be performed by, for example, core mapping logic 112 and test logic 114. Operations according to this embodiment include determining a first mapping 512. This may include, for example, core mapping logic 112 determining a mapping of functional blocks of an application to physical and logical cores of a processor. In some embodiments, the first mapping assigns every functional block to a single logical core, e.g. 350 of FIG. 3. In other embodiments, the first mapping may have every functional block assigned to a different logical core, e.g., 460 of FIG. 4 (assuming there are sufficient physical/logical cores). Operations further include initializing a look-up table (such as LUT 115) and storing the first mapping in the LUT 514.

Operations may further test throughput of the application according to the first mapping 516. This may include, for example, test logic 114 assigning the functional blocks of the application according to the first mapping, causing the application to be executed, and determining a throughput of the application as it executes (e.g., in mpps). 516 may further include adding the tested throughput of the mapping to the corresponding entry on the LUT. Operations further include determining whether the tested throughput meets a performance target 518. This may include a threshold comparison, wherein the performance target is a threshold value in mpps. In some embodiments, the tested performance and performance target may be measured as throughput accounting for the number of physical cores used (e.g., mpps/core), while in other embodiments the tested performance and performance target may account for the number of logical cores used (e.g., mpps/Lcore). In some embodiments, the tested performance metric may account for the amount of memory used (e.g., mpps/KB), power used (mpps/W), etc. If the throughput meets the target (518 "Yes"), operations may include selecting the mapping as the "best" mapping 532. If the tested throughput does not meet the performance target (518 "No"), operations further include determining an additional mapping 520. This may be performed by, for example, core mapping logic 112. Operations further include evaluating whether the mapping determined at 520 (referred to herein for simplicity as the "current" mapping) is redundant with any previous mapping 522. This may include comparing the distribution of functional blocks of the application in the current mapping to those stored in the LUT, and may be performed by, for example, core mapping logic 112. In this example, "redundant" may follow the definitions and examples described above with regard to FIG. 3 and FIG. 4, e.g. that physical cores and logical cores are generally interchangeable.

If the current mapping is determined to be redundant with a previous mapping (522 "Yes"), operations may further include determining whether all non-redundant mappings have been tested or otherwise evaluated 530. If all non-redundant mappings are determined to have been tried (530 "Yes"), operations may proceed to select the best mapping 532 (e.g., from the LUT 115). Note that according to example operations 500, this case (530 "Yes") results in selecting a best mapping 532 without identifying a mapping that meets the performance target (e.g., 518 and 528 were never "Yes"). If all non-redundant mappings have not been tried (530 "No"), operations may return to determine an additional mapping 520. If the current mapping is not determined to be redundant with any previous mapping (522 "No"), operations may further include adding the current mapping to the LUT 524. Operations also include testing the throughput of the current mapping 526. This may be performed in a similar manner to 516; e.g., assigning the functional blocks of the application according to the current mapping, executing the application, determining performance of the application, etc. At 526, the determined performance of the application according to the current mapping may be added to the corresponding entry of LUT 115.

Operations further include determining whether the performance of the application according to the current mapping meets the performance target 528. This may be performed similarly to 518; e.g., comparing the determined performance to a threshold value representing a target performance metric. If the current mapping does not meet the performance target (528 "No"), operations may include determining whether all non-redundant mappings have been tested 530, as described above. If the current mapping meets the performance target (528 "Yes") operations may include selecting the best mapping 532 (e.g., from the LUT 115). As the operations described in this example describe selecting the best mapping once a current mapping meets a performance target, the selected best mapping will often be the current mapping (unless no mapping meets the performance target and all non-redundant mappings are tested, e.g. 530 "Yes").

As described above, in the example of FIG. 5, core mapping logic 112 may be configured to determine whether all possible non-redundant mappings have been evaluated 530. This may include, for example, comparing the LUT of tested mappings with a known table of all possible mappings. The known table may be determined ahead of time by, e.g., core mapping logic 112. In some embodiments, rather than determine all possible mappings ahead of time, core mapping logic 112 may be configured to determine a single mapping at a time, determine if the mapping is redundant, test the mapping if it is not redundant and disregarding the mapping if it is redundant. In these or other embodiments, once a mapping is tested or disregarded, core mapping logic 112 may determine an additional mapping and repeat the process. However, in some embodiments, the size of the LUT and the characteristics of the processing system may be used (by, e.g., core mapping logic 112) to determine whether any non-redundant mappings remain (e.g., have not yet been considered). For example, as in FIG. 3, above, if only a single physical core with 2 logical cores is being considered, core mapping logic 112 may determine that there are 4 non-redundant mappings. As redundant mappings may not be added to LUT 115, when evaluating a newly-determined mapping, core mapping logic 112 may compare a number of entries in LUT 115 (e.g., corresponding to a number of non-redundant mappings that have already been evaluated) to the determined total number of non-redundant mappings (here, 4). This may allow the node (e.g., node 102A) to determine whether all non-redundant mappings have been tested using, for example, a size determination of LUT 115 and a non-redundant mappings table, rather than determining a list of all possible mappings and checking each one for redundancy. The non-redundant mappings table may include pre-calculated numbers of non-redundant mappings based on, e.g., the number of logical cores per physical cores (LC), the number of physical cores (PC), and the number of functional blocks of the application (FB). In some embodiments, a governing equation may be derived using PC, LC and FB. This may conserve computational resources. While this savings may be negligible for smaller-scale evaluations (such as the 4 possibilities described in this example), as the number of functional blocks, physical cores, and/or logical cores increases, determining a full table of possible mappings may become disadvantageously computationally expensive. In some embodiments, core mapping logic 112 may be configured to determine a full table of possible permutations, evaluate the table for redundancies, and thus determine a table of possible non-redundant mappings. This may be performed at, for example, initialization of core mapping logic 112, loading of application 110, etc. In some embodiments, this table may be pre-provided (e.g., by a manufacturer of node 102A). In these or other embodiments, core mapping logic 112 may simply check the current mapping against the table of known possible non-redundant mappings.

In the example described above, as each mapping is determined, the newly determined mapping is evaluated for redundancy and, assuming it is not determined to be redundant with any previous mapping, tested to see if the mapping meets a performance target. Thus, in this embodiment, the first mapping to meet the performance target is selected, which may avoid performing unnecessary testing on additional mappings when a satisfactory solution has already been determined. As a trade-off, the selected mapping of this embodiment is not guaranteed to be the mapping with the highest or best throughput. In some embodiments, every non-redundant mapping is evaluated and tested before the mapping with the best throughput is selected.

Figure 6:
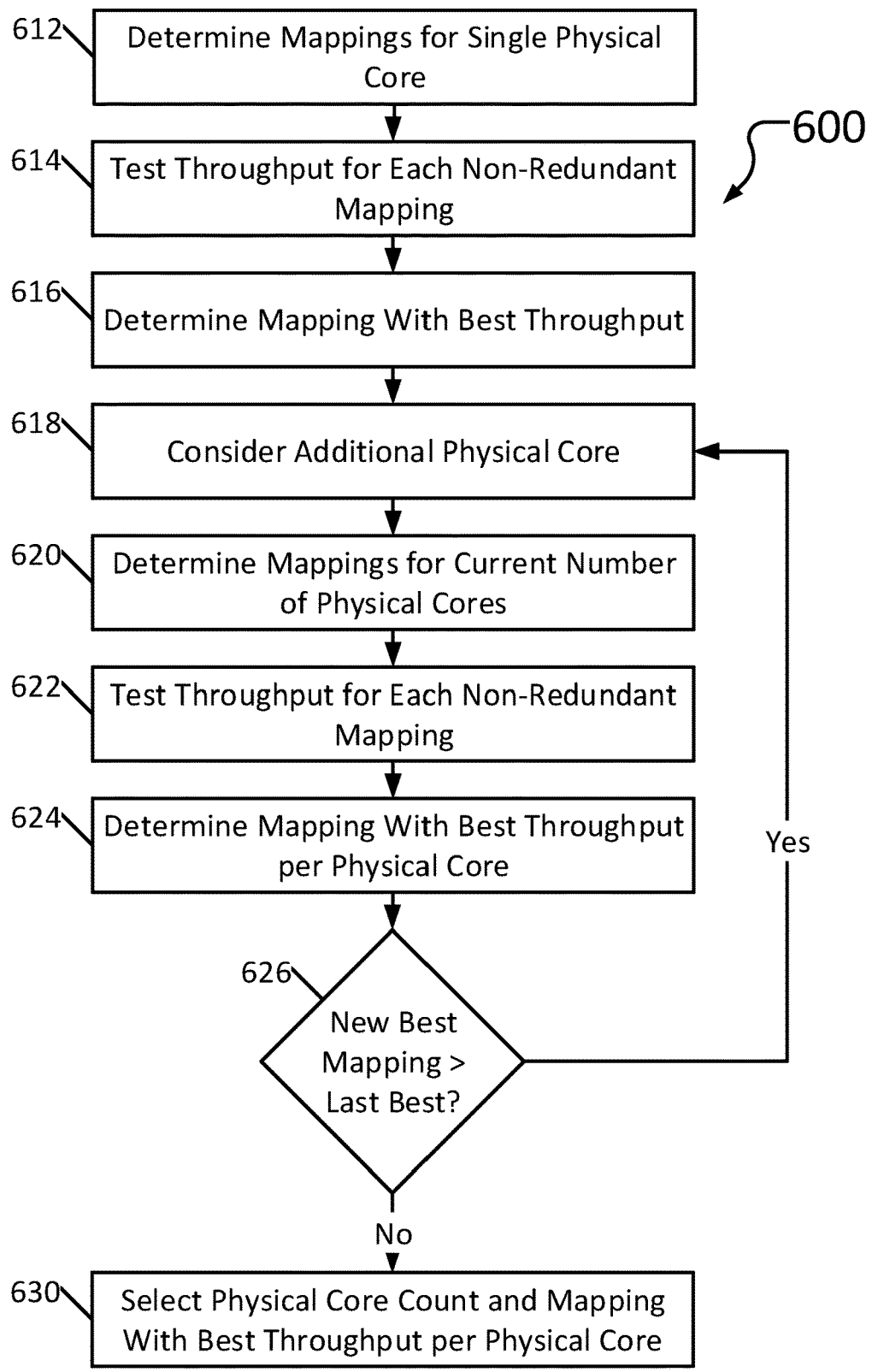
FIG. 6 is a flowchart illustrating operations according to one embodiment of the present disclosure.

FIG. 6 is a flowchart illustrating operations 600 according to one embodiment of the present disclosure. Operations according to this embodiment include determining mappings for a single physical core 612. Operations further include testing throughput of each non-redundant mapping 614. Operations further include determining a mapping with best throughput (e.g., in mpps) 616. Operations also include considering at least one additional physical core 618. For example, as core mapping logic 112 is configured to determine possible and/or non-redundant mappings of functional blocks to logical cores within physical cores, 618 may include causing core mapping logic 112 to consider at least one additional physical core (and associated logical core(s)) when determining functional block mappings.

Operations further include determining mappings for a current number of physical cores 620. This current number of physical cores may vary as operations 600 are performed, but may range from, for example, 1 to a number of available physical cores in a system. 620 may be performed in a manner similar to 612; e.g., by core mapping logic 112. Operations further include testing throughput for each non-redundant mapping 622. This may be performed in a manner similar to 622. Note that as the number of physical cores increases, the number of non-redundant combinations typically increases as well. This trend may continue until the number of physical cores exceeds the number of functional blocks; when PC>FB, at least one physical core will always be "empty" (e.g., one physical core will not have any functional blocks from application 110 mapped to it, though it may still be executing other applications), and since added "empty" physical cores are redundant (e.g., 450 vs. 350, 452 vs. 352, etc.), additional physical cores are generally redundant with at least one previous mapping. For example, taking the example of FIG. 4, adding a third physical core would only add a single non-redundant mapping: that with FBA, FBB and FBC mapped to a logical core of different physical cores. Other 3-physical-core mappings will leave at least one physical core "empty" and will therefore be redundant with at least one 2-physical-core mapping. This may change for different definitions of "redundant," however.

Operations further include determining a new mapping having a best throughput per physical core 624. In some embodiments, this new mapping may be determined from all of the mappings tested (for each number of physical cores considered), while in other embodiments, this new mapping may be determined based only on the current number of physical cores.

Operations of this embodiment may also include determining whether the new best mapping results in a better throughput per physical core than a previous best mapping 626. As an example, a previous best mapping may be a best mapping determined when considering fewer than the current number of physical cores. Thus, in some embodiments, 626 may effectively result in determining whether adding the most recent physical core results in a possible increase in throughput per physical core. If the new best mapping is better (e.g., results in a better throughput per physical core) than all previous best mappings (626 "Yes"), operations may include considering an additional physical core 618. If the new best mapping is not better (e.g., does not result in a better throughput per physical core) than a previous best mapping (626 "No"), then operations may include selecting the superior previous best mapping and corresponding physical core count 630. This may prevent unnecessarily considering additional physical cores, as typically adding physical cores will provide diminishing returns (in terms of throughput per physical core), and eventually any throughput increases of an additional core will be insufficient to justify adding the core.

Typically, systems will only have a limited number of physical cores available. Additionally, the best mapping may have a physical core cap that is lower than the number of physical cores of the system (e.g., half). Thus, in some embodiments, even if a new best mapping is greater than the previous best (626 "Yes"), if no additional physical cores area available or if a physical core cap is reached operations may include selecting the current physical core count 630.

Figure 7:
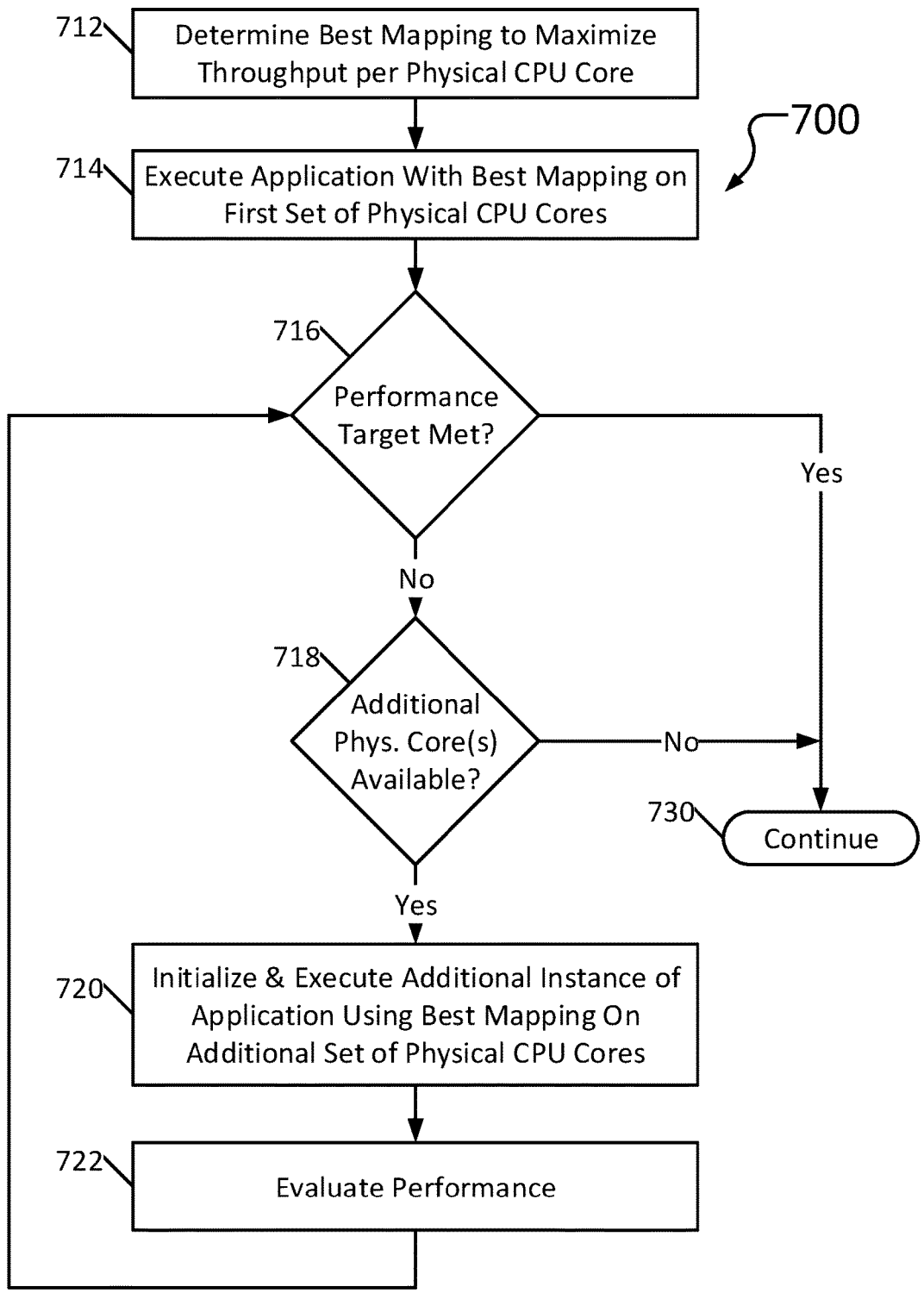
FIG. 7 is a flowchart illustrating operations according to one embodiment of the present disclosure.

FIG. 7 is a flowchart illustrating operations 700 according to one embodiment of the present disclosure. Operations include determining a best mapping to maximize throughput (of an application) per physical CPU core 712. This may be performed by core mapping logic 112 and test logic 114, as described according to FIG. 5 and/or FIG. 6, above. Operations further include executing the application on a first set of physical CPU cores 714. The number of physical CPU cores in this first set may depend upon the determined best mapping of functional blocks of the application, and may range from, for example, 1 physical core to a total number of physical cores available in the system. Operations further include determining whether a performance target is met by the execution of the application 716. This may include, for example, monitoring performance (e.g., throughput or throughput/core) of the application as it is executed and comparing the monitored performance to a performance target (e.g., a threshold value of, for example, 15 mpps). If the performance target is met (716 "Yes"), operations further include continuing execution of the application 730. If the performance target is not met (716 "No"), operations further include determining whether additional physical cores are available 718. In some embodiments, this may include evaluating a number of available physical cores and comparing this number to the number of physical cores required according to the best mapping. For example, if the best mapping requires 4 physical cores, a single instance of the application is executing (on 4 physical cores) and at 718 only 3 additional physical cores are determined to be available (e.g., a system with 7 physical cores), then in some embodiments this would result in 718 "No."

If there are sufficient additional physical cores available (718 "Yes"), operations may further include initializing and executing an additional instance of the application using the best mapping on an additional set of physical cores 720. For example, if the best mapping corresponded to 460 of FIG. 4, then an additional instance of application 110 may be executed on an additional two physical cores using the same (or an equivalent) functional block mapping, resulting in two instances of the application executing. Executing additional instances of the application generally results in improved performance, albeit sometimes with diminishing returns (e.g., total performance may not scale perfectly linearly as more instances are added on more physical cores).

Further operations include evaluating performance of the instance(s) of the application 722, and again determining whether the performance target has been met 716. If the target has still not been met (716 "No,") operations may further include checking for additional cores, initializing additional instances, etc. If there are no additional physical cores available (718 "No") despite the performance target not being met (716 "No"), operations may include executing the application instance(s) 730. In some embodiments, even if additional physical cores are available, additional instances of application 110 may not be initialized or instanced on them if the system executing the application (e.g., node 102A) has reached a limit of a global shared CPU resource (e.g., external memory bandwidth, Last Level Cache, etc.).

Figure 8:
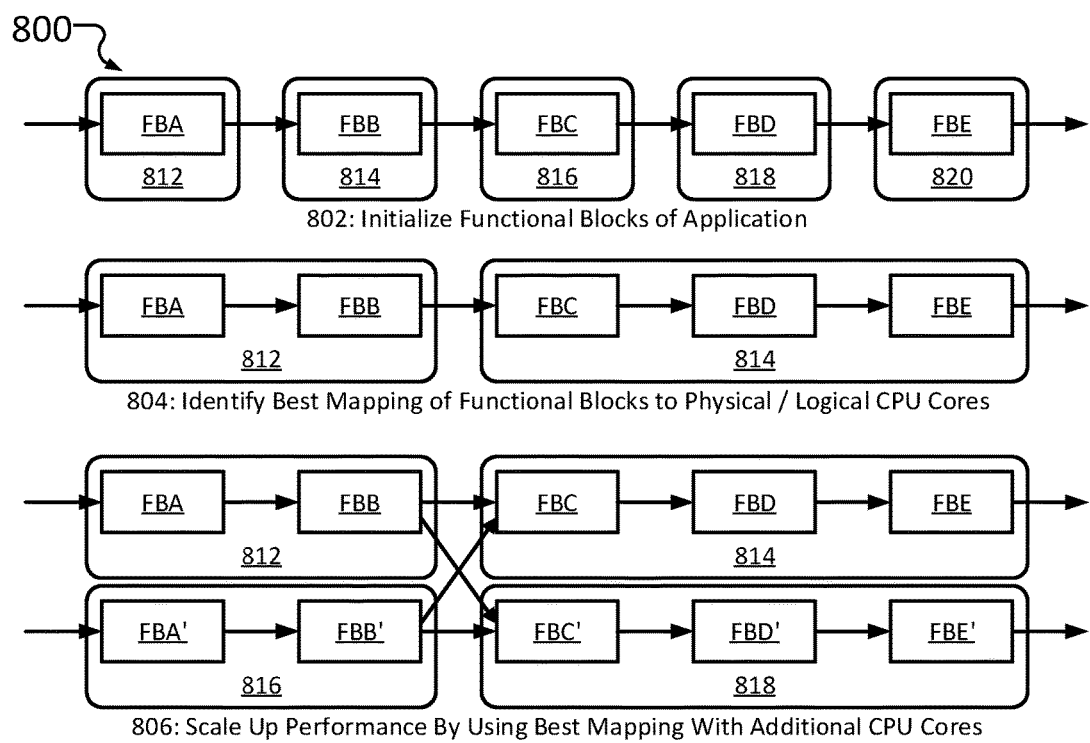
FIG. 8 illustrates example operations and combinations of functional block assignments to physical cores according to one embodiment of the present disclosure.

FIG. 8 illustrates example operations 800 and combinations of functional block assignments to physical cores according to one embodiment of the present disclosure. Operations include initializing functional blocks of an application 802. At first, each functional block (e.g., FBA, FBC . . . FBn, also referred to as 110A, 110B, . . . 110P in FIG. 1) of the application (e.g., application 110) may be assigned to a logical core (logical cores not shown in FIG. 8) of a separate physical core (e.g., 812, 814, 816, etc.). Operations further include identifying a best mapping of the functional blocks to physical/logical cores 804. This may include, for example, operations similar to those described in FIG. 5 or FIG. 6. The "best mapping" of this example is shown to include functional blocks FBA and FBB assigned to a first physical core 812 and functional blocks FBC, FBD and FBE assigned to a second physical core 814. Operations may further include scaling up the performance of the application by executing additional instances of the application on additional sets of CPU cores 806. This may include, for example, operations similar to those described in FIG. 7. Additional instances are represented by functional blocks FBA', FBB' . . . FBE' executing on additional cores 816 and 818. Further instances of the application (not shown in FIG. 8) may be added to further increase performance, provided the CPU cores and resources are available and a performance target has not been met (as described with regard to FIG. 7).

Each physical CPU core typically has several logical cores (for example, hyper-threads). This is a hardware mechanism, and many typical CPUs have 2 logical cores for each physical core. In the context of this disclosure, the term CPU core is used to designate a logical core (in some systems, equivalent to a hyper-thread). In some embodiments, for each available logical core, a software (SW) thread (typically a portable operating system interface (POSIX) thread) may be created and affinitized (i.e. bound) to that CPU core. This may prevent an Operating System process scheduler (e.g., a Linux kernel) from migrating a current SW thread from one CPU core to another, which may otherwise typically result in L1/L2 cache thrashing resulting in a negative impact on performance as described above. For the purpose of this disclosure, "CPU thread" or "hardware (HW) thread" refers to a logical core having a single SW thread affinitized to it.

CPU threads may run one or several functional block instances that have been explicitly mapped or assigned to that CPU thread. Some CPU threads may have no functional block instances mapped to them. When more than one block instance is mapped to a given CPU thread, the thread may run the block instances in a time-sharing manner. Running a block instance involves executing a run function of the functional block for the current block instance, which typically reads a burst of input packets from an input packet queue (such as, for example input packet queue 204(1) of FIG. 2) and completely handles each packet in order until the packet is either dropped or dispatched to one of the output packet queues (such as, for example, output queue 206(1)). The next time the same block instance is run, the next input packet queue (e.g., 204(2)) is served, so over time the input packet queues are served in round-robin fashion.

The CPU thread scheduling strategy for the block instances mapped to it can vary from simple to more complex approaches. One example approach is to run the block instances in round-robin fashion. For example, given two functional block instances 110A and 110B, a round-robin approach may involve serving a next input packet queue of a first block instance (referred to herein as 204(1)A) before serving a next input packet queue of a second block instance (e.g., 204(1)B), and then proceeding to a following input packet queue of the first block instance (e.g., 204(2)A), etc. Another example approach is to serve all the input packet queues of the current block instance before moving to the next block instance. Using the same illustrative two block instance example, this may involve serving input queues 204(1)A-204(R)A before proceeding to serve input queue 204(1)B, etc. Each block instance can also be assigned a weight in order to serve some block instances more often than others (weighted round-robin).

Each CPU thread may periodically poll the input message queues of each of the block instances assigned to it in order to handle any pending configuration requests for the block instances. Typically, the block instances are handled in simple round-robin fashion for the purpose of configuration changes. The fact that the same thread handles both the regular packet processing as well as configuration changes (typically resulting in updates of the block instance data structures and associated tables) simplifies the functional block design and implementation (no thread safety required for accessing the block instance private data structures and tables).

Each CPU thread may also include dedicated input and output message queues. For example, an external controller or Command Line Interface (CLI) can dynamically remap a given block instance from a first CPU thread to a second CPU thread by sending a configuration request message to the first CPU thread to suspend the given block instance (so the first CPU thread is no longer executing the given block instance), then send a request message to the second CPU thread to add this block instance to the set of block instances it currently handles. The external controller or CLI also generally use the CPU thread message queues to periodically poll for block instance (e.g. number of input packets, number of dropped input packets, etc.) or thread statistics counters (e.g. CPU cycle headroom, etc.).

Application topology of interconnected block instances may be constructed through a configuration file loaded by the application, e.g. during an application initialization phase. By specifying a CPU thread ID (e.g., the tuple of CPU socket ID, physical CPU core ID, hyper-thread ID) for each block instance in a configuration file, the topology of inter-connected CPU cores is implicitly defined; it can later be updated through the CLI commands for dynamic block instance re-mapping to different CPU thread. This is how any topology of CPU cores can be constructed, with no need to limit the possibilities to just pure pipeline (series of CPU cores) or pure run-to-completion (CPU cores in parallel), as any hybrid topology can be constructed.

The network interface circuitry 108 may communicate with one or more remote systems using, for example, an Ethernet communications protocol. The Ethernet communications protocol may be capable of providing communication using a Transmission Control Protocol/Internet Protocol (TCP/IP). The Ethernet protocol may comply or be compatible with the Ethernet standard published by the Institute of Electrical and Electronics Engineers (IEEE) titled "IEEE 802.3 Standard," published in March, 2002 and/or later versions of this standard, for example, the IEEE 802.3 Standard for Ethernet, published 2012; "IEEE Std 802.3bj™", published 2014, titled: IEEE Standard for Ethernet Amendment 2: Physical Layer Specifications and Management Parameters for 100 Gb/s Operation Over Backplanes and Copper Cables; IEEE P802.3by D0.1, titled: Draft Standard for Ethernet Amendment: Media Access Control Parameters, Physical Layers and Management Parameters for 25 Gb/s Operation; etc. In other embodiments, the network interface circuitry 108 may communicate with one or more remote systems using, for example, a custom and/or proprietary communications protocol.

The system memory 106 may comprise one or more of the following types of memory: semiconductor firmware memory, programmable memory, non-volatile memory, read only memory, electrically programmable memory, random access memory, flash memory, magnetic disk memory, and/or optical disk memory. Either additionally or alternatively system memory may comprise other and/or later-developed types of computer-readable memory.

Embodiments of the operations described herein may be implemented in a system that includes at least one tangible computer-readable storage device having stored thereon, individually or in combination, instructions that when executed by one or more processors perform the methods. The storage device may include any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage device suitable for storing electronic instructions.

In some embodiments, a hardware description language (HDL) may be used to specify circuit and/or logic implementation(s) for the various, logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

"Logic," as used herein, may comprise, singly or in any combination circuitry and/or code and/or instructions sets (e.g., software, firmware, etc.). "Circuitry," as used in any embodiment herein, may comprise, for example, singly or in any combination, hardwired circuitry, programmable circuitry, state machine circuitry, and/or firmware that stores instructions executed by programmable circuitry. The circuitry may be embodied as an integrated circuit, such as an integrated circuit chip.

The following examples pertain to further embodiments. The following examples of the present disclosure may comprise subject material such as an apparatus, a method, at least one machine-readable medium for storing instructions that when executed cause a machine to perform acts based on the method, means for performing acts based on the method and/or a system to assign functional blocks to one or more logical cores of one or more physical cores of a processor.

According to example 1, there is provided an apparatus capable of mapping functional blocks to one or more logical cores of one or more physical cores of a processor. The apparatus may comprise processor circuitry including a plurality of physical cores, each physical core having a plurality of logical cores, the processor circuitry to execute an application including a set of functional blocks, core mapping logic to determine a plurality of non-redundant assignments of the set of functional blocks to at least one of the logical cores of at least one physical core selected from the plurality of physical cores, and test logic to test each non-redundant assignment of the set of functional blocks, and determine, based on the testing, a performance metric of the application in operation, wherein the core mapping logic is further to select an assignment that meets a predefined performance requirement based on the determined performance metric.

Example 2 may include the elements of example 1, wherein each of the set of functional blocks includes a plurality of message queues including at least one input message queue and at least one output message queue, and each of the set of functional blocks further includes a plurality of packet queues including at least one input packet queue and at least one output packet queue.

Example 3 may include the elements of example 2, wherein the core mapping logic is further to assign the functional blocks to at least one of the logical cores by setting output packet queues of a first subset of the functional blocks as input packet queues of a second subset of the functional blocks.

Example 4 may include the elements of example 2 or example 3, wherein the plurality of packet queues are implemented using single-producer single-consumer lockless queues.

Example 5 may include the elements of any of examples 2 through 4, further comprising a controller to transmit at least one configuration request to at least one of the functional blocks via at least one of the input message queues, and receive at least one response from at least one of the functional blocks via at least one of the output message queues.

Example 6 may include the elements of any of examples 1 through 5, wherein the plurality of physical cores are each generally functionally equivalent to one another, and the logical cores are generally functionally equivalent to one another.

Example 7 may include the elements of any of examples 1 through 6, wherein the test logic is further to determine, based on the testing, a best non-redundant assignment of the set of functional blocks, the best non-redundant assignment being the non-redundant assignment having a maximum determined performance metric.

Example 8 may include the elements of example 7, wherein the processor circuitry is to execute at least one additional instance of the application on at least one additional physical core selected from the plurality of physical cores, the additional instance of the application having an additional set of functional blocks.

Example 9 may include the elements of example 8, wherein the core mapping logic is further to assign each of the additional set of functional blocks at least one logical core of the at least one additional physical core based on the best non-redundant assignment.

Example 10 may include the elements of any of examples 1 through 9, further comprising a system memory to store a look-up table, and wherein the core mapping logic is further to store the non-redundant assignments in the look-up table.

Example 11 may include the elements of example 10, wherein the testing logic is further to store the determined performance metric corresponding to each non-redundant assignment in the look-up table.

Example 12 may include the elements of any of examples 1 through 11, wherein the performance metric is a throughput of the application per physical core.

According to example 13, there is provided a functional block mapping method. The method may comprise determining, via core mapping logic, a plurality of non-redundant assignments of a set of functional blocks of an application to at least one of a plurality of logical cores of at least one of a plurality of physical cores of a processor, testing, via test logic, each of the plurality of non-redundant assignments of the set of functional blocks, determining, via the test logic based on the testing, a performance metric of the application for each non-redundant assignment, selecting, via the core mapping logic, an assignment that meets a predefined performance requirement based on the determined performance metrics, and executing, via the processor based on the selected assignment, the application.

Example 14 may include the elements of example 13, wherein each of the set of functional blocks includes a plurality of message queues including at least one input message queue and at least one output message queue, and each of the set of functional blocks further includes a plurality of packet queues including at least one input packet queue and at least one output packet queue.

Example 15 may include the elements of example 14, further comprising assigning, by the core mapping logic, the functional blocks to at least one of the logical cores by setting output packet queues of a first subset of the functional blocks as input packet queues of a second subset of the functional blocks.

Example 16 may include the elements of example 14 or example 15, wherein the plurality of packet queues are implemented using single-producer single-consumer lockless queues.

Example 17 may include the elements of any of examples 14 through 16, further comprising transmitting, via a controller, at least one configuration request to at least one of the functional blocks via at least one of the input message queues, and receiving, by the controller, at least one response from at least one of the functional blocks via at least one of the output message queues.

Example 18 may include the elements of any of examples 13 through 17, wherein the plurality of physical cores are each generally functionally equivalent to one another, and the logical cores are generally functionally equivalent to one another.

Example 19 may include the elements of any of examples 13 through 18, further comprising determining, via the test logic based on the testing, a best non-redundant assignment of the set of functional blocks, the best non-redundant assignment being the non-redundant assignment having a maximum determined performance metric.

Example 20 may include the elements of example 19, further comprising executing, via the processor, at least one additional instance of the application on at least one additional physical core selected from the plurality of physical cores, the additional instance of the application having an additional set of functional blocks.

Example 21 may include the elements of example 20, further comprising assigning, via the core mapping logic based on the best non-redundant assignment, each of the additional set of functional blocks at least one logical core of the at least one additional physical core.

Example 22 may include the elements of any of examples 13 through 21, further comprising storing, via the core mapping logic, the non-redundant assignments in a lookup table on a system memory.

Example 23 may include the elements of example 22, further comprising storing, via the testing logic, the determined performance metric corresponding to each non-redundant assignment in the lookup table.

Example 24 may include the elements of any of examples 13 to 23, wherein the performance metric is a throughput of the application per physical core.

According to example 25 there is provided a system including at least one device, the system being arranged to perform the method of any of the above examples 13 through 24.

According to example 26 there is provided a chipset arranged to perform the method of any of the above examples 13 through 24.

According to example 27 there is provided at least one non-transitory computer readable storage device having stored thereon instructions that, when executed on a computing device, cause the computing device to carry out the method according to any of the above examples 13 through 24.

According to example 28 there is provided at least one apparatus configured for changelog reserved area prediction, the at least one apparatus being arranged to perform the method of any of the above examples 13 through 24.

According to example 29 there is provided a system. The system may comprise means for determining a plurality of non-redundant assignments of a set of functional blocks of an application to at least one of a plurality of logical cores of at least one of a plurality of physical cores of a processor, means for testing each of the plurality of non-redundant assignments of the set of functional blocks, means for determining, based on the testing, a performance metric of the application for each non-redundant assignment, means for selecting an assignment that meets a predefined performance requirement based on the determined performance metrics, and means for executing the application.

Example 30 may include the elements of example 29, wherein each of the set of functional blocks includes a plurality of message queues including at least one input message queue and at least one output message queue, and each of the set of functional blocks further includes a plurality of packet queues including at least one input packet queue and at least one output packet queue.

Example 31 may include the elements of example 30, further comprising means for assigning the functional blocks to at least one of the logical cores by setting output packet queues of a first subset of the functional blocks as input packet queues of a second subset of the functional blocks.

Example 32 may include the elements of example 30 or example 31, wherein the plurality of packet queues are implemented using single-producer single-consumer lockless queues.

Example 33 may include the elements of any of examples 30 through 32, further comprising means for transmitting at least one configuration request to at least one of the functional blocks via at least one of the input message queues, and means for receiving at least one response from at least one of the functional blocks via at least one of the output message queues.

Example 34 may include the elements of any of examples 29 through 33, wherein the plurality of physical cores are each generally functionally equivalent to one another, and the logical cores are generally functionally equivalent to one another.

Example 35 may include the elements of any of examples 29 through 34, further comprising means for determining a best non-redundant assignment of the set of functional blocks, the best non-redundant assignment being the non-redundant assignment having a maximum determined performance metric.

Example 36 may include the elements of example 35, further comprising means for executing at least one additional instance of the application on at least one additional physical core selected from the plurality of physical cores, the additional instance of the application having an additional set of functional blocks.

Example 37 may include the elements of example 36, further comprising means for assigning, based on the best non-redundant assignment, each of the additional set of functional blocks at least one logical core of the at least one additional physical core.

Example 38 may include the elements of any of examples 29 through 37, further comprising means for storing the non-redundant assignments in a lookup table on a system memory.

Example 39 may include the elements of example 38, further comprising means for storing the determined performance metric corresponding to each non-redundant assignment in the lookup table.

Example 40 may include the elements of any of examples 29 through 31, wherein the performance metric is a throughput of the application per physical core.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

What is claimed is:

1. A network node element, comprising:
    processor circuitry including a plurality of physical cores, each physical core of the plurality of physical cores having a plurality of logical cores, the processor circuitry configured to perform execution of an application including a set of functional blocks;
    core mapping logic configured to determine a plurality of non-redundant assignments of the set of functional blocks to at least one logical core of the plurality of logical cores of at least one physical core selected from the plurality of physical cores; and
    test logic configured to:
        perform testing of each non-redundant assignment of the set of functional blocks; and
        determine, based on one or more results of the testing, a performance metric of the application during the execution;
    wherein the core mapping logic is further configured to select an assignment that meets a predefined performance requirement based on the determined performance metric.

2. The network node element of claim 1, wherein:
    each functional block of the set of functional blocks includes a plurality of message queues including at least one input message queue and at least one output message queue; and
    each functional block of the set of functional blocks further includes a plurality of packet queues including at least one input packet queue and at least one output packet queue.

3. The network node element of claim 2, wherein the core mapping logic is further configured to assign functional blocks to at least one logical core of the plurality of logical cores by setting output packet queues of a first subset of the set of functional blocks as input packet queues of a second subset of the set of functional blocks.

4. The network node element of claim 2, wherein the plurality of packet queues are implemented using circular queues.

5. The network node element of claim 1, wherein the test logic is further configured to determine, based on the one or more results of the testing, a non-redundant assignment of the set of functional blocks, the determined non-redundant assignment having a maximum determined performance metric.

6. The network node element of claim 5, wherein:
    the processor circuitry is further configured to execute at least one additional instance of the application on at least one additional physical core selected from the plurality of physical cores, the at least one additional instance of the application having an additional set of functional blocks; and
    the core mapping logic is further configured to assign each functional block of the additional set of functional blocks at least one logical core of the at least one additional physical core based on the determined non-redundant assignment.

7. The network node element of claim 1, further comprising a system memory to store a look-up table, wherein:
    the core mapping logic is further configured to store the plurality of non-redundant assignments in the look-up table; and
    the testing logic is further configured to store the determined performance metric corresponding to each non-redundant assignment of the plurality of non-redundant assignments in the look-up table.

8. The network node element of claim 1, wherein the performance metric is a throughput of the application per physical core.

9. A computer-implemented method, comprising:
    determining, via core mapping logic, a plurality of non-redundant assignments of a set of functional blocks of an application to at least one logical core of a plurality of logical cores of at least one physical core of a plurality of physical cores of a processor;
    testing, via test logic, each non-redundant assignment of the plurality of non-redundant assignments of the set of functional blocks;
    determining, via the test logic and based on one or more results of the testing, a performance metric of the application for each non-redundant assignment;
    selecting, via the core mapping logic, an assignment that meets a predefined performance requirement based on the determined performance metrics; and
    executing, via the processor based on the selected assignment, the application.

10. The method of claim 9, wherein:
    each functional block of the set of functional blocks includes a plurality of message queues including at least one input message queue and at least one output message queue; and each functional block of the set of functional blocks further includes a plurality of packet queues including at least one input packet queue and at least one output packet queue.

11. The method of claim 10, further comprising assigning, by the core mapping logic, functional blocks to at least one logical core of the plurality of logical cores by setting output packet queues of a first subset of the set of functional blocks as input packet queues of a second subset of the set of functional blocks.

12. The method of claim 10, wherein the plurality of packet queues are implemented using circular queues.

13. The method of claim 9, further comprising determining, via the test logic and based on the one or more results of the testing, a non-redundant assignment of the set of functional blocks, the determined non-redundant assignment having a maximum determined performance metric.

14. The method of claim 13, further comprising:
executing, via the processor, at least one additional instance of the application on at least one additional physical core selected from the plurality of physical cores, the at least one additional instance of the application having an additional set of functional blocks; and
assigning, via the core mapping logic based on the determined non-redundant assignment, each functional block of the additional set of functional blocks at least one logical core of the at least one additional physical core.

15. The method of claim 9, further comprising:
storing, via the core mapping logic, the plurality of non-redundant assignments in a lookup table on a system memory; and
storing, via the testing logic, the determined performance metric corresponding to each non-redundant assignment of the plurality of non-redundant assignments in the lookup table.

16. The method of claim 9, wherein the performance metric is a throughput of the application per physical core.

17. At least one non-transitory computer-readable storage medium having instructions stored thereon which, when executed by at least one processor, cause the at least one processor to perform functional block mapping operations comprising:
determining a plurality of non-redundant assignments of a set of functional blocks of an application to at least one logical core of a plurality of logical cores of at least one physical core of a plurality of physical cores of the at least one processor;
testing each non-redundant assignment of the plurality of non-redundant assignments of the set of functional blocks;
determining, based on one or more results of the testing, a performance metric of the application for each non-redundant assignment;
selecting, based on the determined performance metrics, an assignment that meets a predefined performance requirement; and
executing the application based on the selected assignment.

18. The at least one non-transitory computer-readable storage device of claim 17, wherein:
each functional block of the set of functional blocks includes a plurality of message queues including at least one input message queue and at least one output message queue; and
each functional block of the set of functional blocks further includes a plurality of packet queues including at least one input packet queue and at least one output packet queue.

19. The at least one non-transitory computer-readable storage device of claim 18, wherein the instructions, when executed by the at least one processor, cause the one or more processors to perform additional operations comprising:
assigning functional blocks to at least one logical core of the plurality of logical cores by setting output packet queues of a first subset of the set of functional blocks as input packet queues of a second subset of the set of functional blocks.

20. The at least one non-transitory computer-readable storage device of claim 18, wherein the plurality of packet queues are implemented using circular queues.

21. The at least one non-transitory computer-readable storage device of claim 17, wherein the instructions, when executed by the at least one processor, cause the at least one processor to perform additional operations comprising:
determining, based on the one or more results of the testing, a non-redundant assignment of the set of functional blocks, the determined non-redundant assignment having a maximum determined performance metric.

22. The at least one non-transitory computer-readable storage device of claim 21, wherein the instructions, when executed by the at least one processor, cause the at least one processor to perform additional operations comprising:
executing at least one additional instance of the application on at least one additional physical core selected from the plurality of physical cores, the at least one additional instance of the application having an additional set of functional blocks; and
assigning, based on the determined non-redundant assignment, each functional block of the additional set of functional blocks at least one logical core of the at least one additional physical core.

23. The at least one non-transitory computer-readable storage device of claim 17, wherein the instructions, when executed by the at least one processor, cause the at least one processor to perform additional operations comprising:
storing each non-redundant assignment of the plurality of non-redundant assignments in a lookup table; and
storing the determined performance metric corresponding to each non-redundant assignment of the plurality of non-redundant assignments in the lookup table.

24. The at least one non-transitory computer-readable storage device of claim 17, wherein the performance metric is a throughput of the application per physical core.

* * * * *